United States Patent
Fjelstad et al.

(10) Patent No.: US 7,750,446 B2
(45) Date of Patent: Jul. 6, 2010

(54) IC PACKAGE STRUCTURES HAVING SEPARATE CIRCUIT INTERCONNECTION STRUCTURES AND ASSEMBLIES CONSTRUCTED THEREOF

(75) Inventors: Joseph C. Fjelstad, Maple Valley, WA (US); Kevin P. Grundy, Fremont, CA (US); Gary Yasumura, Santa Clara, CA (US)

(73) Assignee: Interconnect Portfolio LLC, Cupertino, CA (US)

( * ) Notice: Subject to any disclaimer, the term of this patent is extended or adjusted under 35 U.S.C. 154(b) by 0 days.

(21) Appl. No.: 11/182,484

(22) Filed: Jul. 14, 2005

(65) Prior Publication Data
US 2006/0091507 A1 May 4, 2006

Related U.S. Application Data

(63) Continuation-in-part of application No. 10/426,930, filed on Apr. 29, 2003, now Pat. No. 7,307,293.

(60) Provisional application No. 60/376,482, filed on Apr. 29, 2002, provisional application No. 60/400,180, filed on Jul. 31, 2002, provisional application No. 60/588,312, filed on Jul. 14, 2004.

(51) Int. Cl.
*H01L 23/495* (2006.01)
(52) U.S. Cl. ............... 257/676; 257/674; 257/E23.065
(58) Field of Classification Search ............... 257/688, 257/689, 678
See application file for complete search history.

(56) References Cited

U.S. PATENT DOCUMENTS

| | | | |
|---|---|---|---|
| 3,795,845 A | 3/1974 | Cass et al. | |
| 4,095,866 A | 6/1978 | Merrill | |
| 4,202,007 A | 5/1980 | Dougherty et al. | |
| 4,302,501 A | 11/1981 | Nagashima | |
| 4,445,735 A | 5/1984 | Bonnefoy | |
| 4,458,297 A | 7/1984 | Stopper et al. | |
| 4,543,715 A | 10/1985 | Iadarola et al. | |
| 4,551,673 A | 11/1985 | Barth et al. | |
| 4,636,919 A | 1/1987 | Itakura et al. | |
| 4,644,092 A | 2/1987 | Gentry | |
| 4,675,243 A | 6/1987 | Obinata et al. | |
| 4,730,159 A | 3/1988 | Collins | |
| 4,731,643 A | 3/1988 | Dunham et al. | |
| 4,748,495 A | 5/1988 | Kucharek | |
| 4,768,154 A | 8/1988 | Sliwkowski et al. | |
| 4,799,617 A | 1/1989 | Friedman | |
| 4,812,792 A | 3/1989 | Leibowitz | |
| 4,814,945 A | 3/1989 | Leibowitz | |
| 4,838,800 A | 6/1989 | Lynch | |
| 4,861,251 A | 8/1989 | Moitzger | |
| 4,881,905 A | 11/1989 | Demler, Jr. et al. | |

(Continued)

OTHER PUBLICATIONS

PCT International Search Report, dated Nov. 3, 2003, 88 pages.

*Primary Examiner*—Sue Purvis
*Assistant Examiner*—Krista Soderholm
(74) *Attorney, Agent, or Firm*—Ronald R. Shea, Esq.

(57) ABSTRACT

Disclosed are IC package structures comprised of standard IC packages modified with separate circuit interconnection structures and disposed to interconnect either directly to other IC packages or to intermediate pedestal connectors which serve to support and interconnect various circuit elements, thus effectively allowing critical signals to bypass the generally less capable interconnection paths within standard interconnection substrates.

41 Claims, 11 Drawing Sheets

U.S. PATENT DOCUMENTS

| | | | |
|---|---|---|---|
| 4,912,603 A | 3/1990 | Seyama | |
| 4,935,584 A | 6/1990 | Boggs | |
| 4,956,749 A | 9/1990 | Chang | |
| 4,960,386 A | 10/1990 | Stanevich | |
| 4,969,826 A | 11/1990 | Grabbe | |
| 4,982,311 A | 1/1991 | Dehaine et al. | |
| 4,991,115 A | 2/1991 | Guthrie et al. | |
| 4,994,938 A | 2/1991 | Baudouin | |
| 5,009,611 A | 4/1991 | Regnier | |
| 5,012,924 A | 5/1991 | Murphy | |
| 5,019,946 A | 5/1991 | Eichelberger et al. | |
| 5,136,123 A | 8/1992 | Kobayashi et al. | |
| 5,155,577 A | 10/1992 | Chance et al. | |
| 5,162,792 A | 11/1992 | Morris | |
| 5,165,984 A | 11/1992 | Schoenthaler | |
| 5,185,502 A | 2/1993 | Shepherd et al. | |
| 5,220,490 A | 6/1993 | Weigler et al. | |
| 5,222,014 A | 6/1993 | Lin | |
| 5,227,013 A | 7/1993 | Kumar | |
| 5,291,375 A | 3/1994 | Mukai | |
| 5,309,324 A | 5/1994 | Herandez et al. | |
| 5,319,224 A | 6/1994 | Sakashita et al. | |
| 5,417,577 A | 5/1995 | Holliday et al. | |
| 5,424,492 A | 6/1995 | Petty et al. | |
| 5,441,917 A | 8/1995 | Rostoker et al. | |
| 5,490,040 A | 2/1996 | Gaudenzi et al. | |
| 5,491,364 A | 2/1996 | Brandenburg et al. | |
| 5,498,767 A | 3/1996 | Huddleston et al. | |
| 5,500,862 A | 3/1996 | Kawamura | |
| 5,544,018 A | 8/1996 | Sommerfeldt et al. | |
| 5,545,301 A | 8/1996 | Friese et al. | |
| 5,565,706 A | 10/1996 | Miura et al. | |
| 5,578,870 A | 11/1996 | Farnsworth et al. | |
| 5,584,721 A | 12/1996 | Taniuchi et al. | |
| 5,587,944 A | 12/1996 | Shen et al. | |
| 5,596,205 A | 1/1997 | Reedy et al. | |
| 5,634,093 A | 5/1997 | Ashida et al. | |
| 5,635,424 A | 6/1997 | Rostoker et al. | |
| 5,644,500 A | 7/1997 | Miura et al. | |
| 5,650,662 A * | 7/1997 | Edwards et al. | 257/700 |
| 5,684,332 A | 11/1997 | Chen et al. | |
| 5,686,699 A | 11/1997 | Chu et al. | |
| 5,691,569 A | 11/1997 | Palmer | |
| 5,701,233 A | 12/1997 | Carson et al. | |
| 5,706,178 A | 1/1998 | Barrow | |
| 5,715,274 A | 2/1998 | Rostoker et al. | |
| 5,723,906 A | 3/1998 | Rush | |
| 5,729,432 A | 3/1998 | Shim et al. | |
| 5,730,606 A | 3/1998 | Sinclair | |
| 5,745,374 A | 4/1998 | Matsumoto | |
| 5,774,340 A | 6/1998 | Chang et al. | |
| 5,781,446 A | 7/1998 | Wu | |
| 5,784,262 A | 7/1998 | Sherman | |
| 5,786,631 A | 7/1998 | Fishley et al. | |
| 5,790,383 A | 8/1998 | Inagawa | |
| 5,819,403 A | 10/1998 | Crane, Jr. et al. | |
| 5,822,214 A | 10/1998 | Rostoker et al. | |
| 5,977,640 A | 11/1999 | Bertin et al. | |
| 6,031,283 A * | 2/2000 | Banerjee et al. | 257/698 |
| 6,060,772 A | 5/2000 | Sugawara et al. | |
| 6,087,732 A | 7/2000 | Chittipeddi et al. | |
| 6,121,679 A | 9/2000 | Luvara et al. | |
| 6,137,064 A | 10/2000 | Kiani et al. | |
| 6,150,729 A | 11/2000 | Ghahghahi | |
| 6,181,718 B1 | 1/2001 | Kobayashi et al. | |
| 6,264,476 B1 | 7/2001 | Li et al. | |
| 6,285,560 B1 | 9/2001 | Lyne | |
| 6,304,450 B1 | 10/2001 | Dibene, II et al. | |
| 6,310,303 B1 | 10/2001 | Luvara et al. | |
| 6,310,398 B1 | 10/2001 | Katz | |
| 6,388,208 B1 | 5/2002 | Kiani et al. | |
| 6,465,336 B2 | 10/2002 | Gabara et al. | |
| 6,507,496 B2 | 1/2003 | Levy et al. | |
| 6,547,570 B2 | 4/2003 | Eskildensen et al. | |
| 6,559,531 B1 | 5/2003 | Sutherland | |
| 6,594,811 B2 | 7/2003 | Katz | |
| 6,599,031 B2 | 7/2003 | Li | |
| 6,603,077 B2 | 8/2003 | Hirai | |
| 6,642,808 B2 | 11/2003 | Koriyama et al. | |
| 6,686,666 B2 | 2/2004 | Bodas | |
| 6,704,204 B1 | 3/2004 | Eskildsen et al. | |
| 6,712,648 B2 * | 3/2004 | Padro et al. | 439/701 |
| 6,797,891 B1 | 9/2004 | Blair et al. | |
| 6,867,668 B1 | 3/2005 | Diagostino et al. | |
| 6,882,546 B2 | 4/2005 | Miller | |
| 6,893,885 B2 | 5/2005 | Lemmerhirt et al. | |
| 6,977,411 B2 * | 12/2005 | Ito et al. | 257/318 |
| 6,985,659 B2 | 1/2006 | Torigoe et al. | |
| 7,345,359 B2 * | 3/2008 | Kim et al. | 257/678 |
| 2003/0048998 A1 | 3/2003 | Li | |
| 2003/0095014 A1* | 5/2003 | Lao et al. | 333/33 |
| 2003/0098502 A1* | 5/2003 | Sota | 257/688 |
| 2003/1018000 | 9/2003 | Loh et al. | |
| 2003/0222282 A1* | 12/2003 | Fjelstad et al. | 257/200 |
| 2004/0094328 A1 | 5/2004 | Fjelstad et al. | |
| 2004/0113250 A1 | 6/2004 | Khandros et al. | |
| 2004/0218372 A1* | 11/2004 | Hamasaki et al. | 361/767 |
| 2004/0227258 A1* | 11/2004 | Nakatani | 257/787 |
| 2005/0087356 A1 | 4/2005 | Forcier | |
| 2005/0133929 A1 | 6/2005 | Howard | |
| 2006/0091507 A1 | 5/2006 | Fjelstad et al. | |

* cited by examiner

IC PACKAGE STRUCTURES HAVING SEPARATE CIRCUIT INTERCONNECTION STRUCTURES AND ASSEMBLIES CONSTRUCTED THEREOF

CROSS REFERENCE TO RELATED APPLICATIONS

The present application is a continuation-in-part and incorporates by reference in its entirety, U.S. patent application Ser. No. 10/426,930, filed Apr. 29, 2003, and now U.S. Pat. No. 7,307,293, issued on Dec. 12, 2007, which claims benefit of U.S. Provisional Applications 60/376,482, filed Apr. 29, 2002, and U.S. Provisional Application 60/400,180 filed Jul. 31, 2002; all of which are incorporated by reference herein. The present application also claims benefit of and incorporates by reference in its entirety, U.S. Provisional Application No. 60/588,312, filed Jul. 14, 2004.

FIELD OF THE INVENTION

The present invention relates to the field of integrated circuit packaging and interconnection.

BACKGROUND

Electronic packaging and specifically integrated circuit packaging and the interconnection between such devices have become a significant performance limiting elements of electronic circuits. Presently, semiconductors operate at internal clock speeds that surpass the current electronic interconnection infrastructure's ability to carry signals between semiconductors.

Copper (and other conductive metal) interconnect elements, including but not limited to semiconductor substrates (packages), connectors, and printed circuit boards have not followed the historical curve of semiconductor speed improvement; although arguably it has not been until recently that the copper interconnect represented a significant performance barrier in chip-to-chip systems. A well designed interconnection channel would allow two or more IC chips in close proximity to one another to communicate at their native speeds, as if they were a single chip.

Copper is in fact capable of transmitting signals at near the speed of light in a vacuum or air. However, in practice electrical circuits cannot be practically established in vacuums, and are typically composed of several components that must connect at points of potential discontinuity. The electrical circuits must be held in place physically by structures made of an insulating material, which normally impedes the signal propagation.

Copper interconnect systems typically incorporate several sources of signal discontinuity and disturbance, which degrade signal integrity and reduce speed. These include variances in metal conductor path height, width, length, and materials, proximity to other circuit paths, through-hole vias, connector and solder joints, and capacitive stubs.

One fundamental design objective for high speed circuits is to incorporate the shortest signal path between two objects, which geometry teaches is a straight line. Typically the signal path from chip-to-chip in an electronic system travels from the semiconductor, through the package, into the circuit board, through another package and to the second semiconductor. This approach involves a relatively tortuous circuit route that does not closely track the straight line design objective. However, by routing some or all signals through structures that create signal paths that do not traverse the package or the printed circuit board, a more straight line path can be accomplished. A path that avoids the printed circuit board and the package may also avoid common elements of those structures, such as vias and stubs, as well as other signal disruptors.

New interconnect elements may facilitate the creation of a more direct path for some or all signals. Structures that establish an electrical path directly from one chip to another chip may create performance advantages.

It is believed that such innovations and future products based on them will meet or exceed all cost and performance design requirements with minimal disruption to the manufacturing infrastructure. At the same time, it will remove most current roadblocks to high speed signal transmission from chip to chip.

BRIEF DESCRIPTION OF THE DRAWINGS

The present invention is illustrated by way of example, not by way of limitation, in the figures of the accompanying drawings and in which like reference numerals refer to similar elements and in which.

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. The interconnecting structures may be microstrip or stripline and the signal lines may be either shielded or unshielded.

The present invention expands on concepts disclosed in pending U.S. patent application Ser. No. 10/426,930 entitled "Direct Connect Signaling System", filed Apr. 29, 2003, which is incorporated herein by reference and which describes various embodiments of high-speed signaling systems implemented by connecting electric signal conductors directly between integrated circuit packages so that high-speed signals are transmitted without passing through traces or other conductive structures on or within a printed circuit board. Among the various embodiments described therein, the application describes embodiments that facilitate interconnection of two or more integrated circuit packages which are mounted to a printed circuit board and coupled to one another, either permanently or removably via a circuit or cable, which is suspended, positioned or fixed above the printed circuit board. Some or all high-speed signals, low-speed signals, power or ground may be routed from one integrated circuit package to the other via the circuit or cable, while other signals, power or ground may be routed to the integrated circuit packages via traces and conductive structures that route through the printed circuit board.

Where packaged IC die or chips are interconnected in a typical system all signals leave the first chip, transition through the IC package and exit the IC package, travel through solder connections into the PCB substrate, emerge from the PCB substrate, travel through a second set of soldered connections into another IC package to the IC chip or die contained therein. This signal path typically contains discontinuities which distort and/or reduce the quality and strength of the transmitted signal.

The embodiments in U.S. patent application Ser. No. 10/426,930 set forth alternatives that allow signals to be transmitted "off-the-top" directly between chips by routing signals from one package to another package without traversing the printed circuit board. In one embodiment, signals are launched from the surface of one chip package, through a controlled impedance cable or circuit structure, to a second chip package of similar construction.

Within the embodiments set forth in the present patent application, I/O drivers are connected directly to those signal lines and transmitted through the cable or circuit to the surface of the second chip package.

It is also possible to modify existing packages to convert them into off the top structures by the addition of a top circuit layer structure designed to carry high speed signals. This allows a user of the technology to bond a circuit directly to the top of an existing IC package circuit with limited modifications. In such an embodiment, the chosen I/O terminals formerly needed for IC interconnection to the package and PCB are bypassed and interconnection is instead made directly to the terminals on the cable or circuit mounted onto the package using an electrical connection technology, such as wire bonding or flip chip. Such added cable or circuit structures would provide the paths for some or all high speed signals either proximate to the edge of the body of the package or beyond the edge of the package to a location intermediate between the edge of the package and the chip where interconnections can be made to a terminal block or connector of a design which does not degrade the signal quality.

Alternatively, an embodiment could also provide a top circuit layer structure directly from the chip, off of and away from, the perimeter of the package. Some embodiments may carry the signal away from the chip starting at the chip itself, the bond wire, or the bond pad on the package.

The top circuit layer structure could be made of reinforced materials or non-reinforced materials (i.e., rigid to flexible) and could be made of various materials matching the electrical needs of the application.

These and other embodiments of the invention are disclosed in further detail below with the aid of figures.

Figure 1:
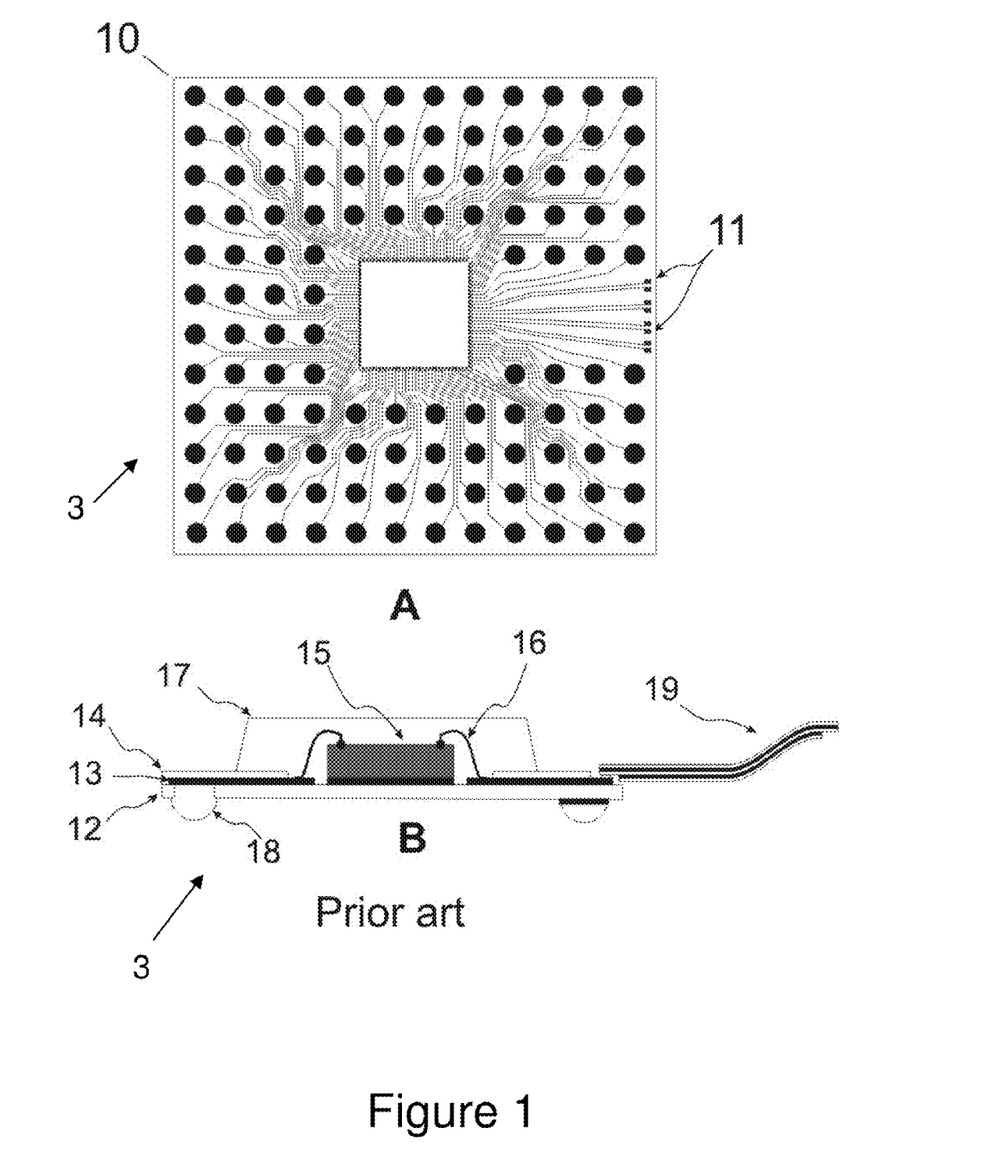
FIG. 1 provides an example of related prior art showing terminations on the surface of an IC package disposed for interconnection at the edge.

FIGS. 1A and 1B depict a prior-art embodiment of an IC package 3 including an IC die 15 mounted in the center of an IC package substrate 10. The IC Package of FIGS. 1A and 1B has been modified in accordance with an embodiment of the invention described in U.S. patent application Ser. No. 10/426,930, which is incorporated by reference herein. As shown in FIG. 1A, selected circuit traces 13 are disposed on the top surface of the package substrate. The circuit traces 13 terminate in first and second ends. The terminations at the first end are positioned near the center of the IC package, for connection to an IC die. The second end of each circuit trace terminates somewhere between the IC die 15 and the edge of the substrate 10. Circuits 11 terminating on the outer edge of the package 3 include terminations for connection to another circuit element such as a controlled impedance flexible cable. FIG. 1B depicts a cross sectional view of the IC package 3 of FIG. 1A, and illustrates a prospective construction, where a flexible or rigid circuit structure 10, such as an IC package substrate, comprises an insulating dielectric base material 12 which has conductive circuit traces 13 with corresponding first and second ends. The circuit traces are, partially protected by a second insulating dielectric material 14 of suitable properties. An IC die 15 is attached to the base circuit structure 10, which can have one or more layers of interconnection wiring comprising internal layers (not shown) and interconnected to traces thereon by means of wire bonds 16. Alternatively, the IC die can be mounted directly to an IC package substrate by flip chip technology that utilizes conductive "bumps," thereby eliminating the need for bond wires 16. In an embodiment utilizing bond wires, IC die and bond wires are protected by an encapsulant 17. Next level connection from the IC package to a structure such as a PCB can be accomplished by a variety of contacts, such as solder balls 18 depicted in FIG. 1B., Within FIGS. 1A and 1B, a second circuit 19, such as a flexible circuit or cable, is attached to the opposite (e.g. upper) surface using a suitable means such as solder or conductive adhesive or by a separable connection (not shown). The circuit 19 can be, but is not limited to, a microstrip or stripline construction and can also be of unshielded differential pairs or single ended or coaxial connections if so desired. One or more of the separate circuits 19 can be mounted on the otherwise unmodified IC package substrate on one or both sides if desired.

Figures 2A, 2B:
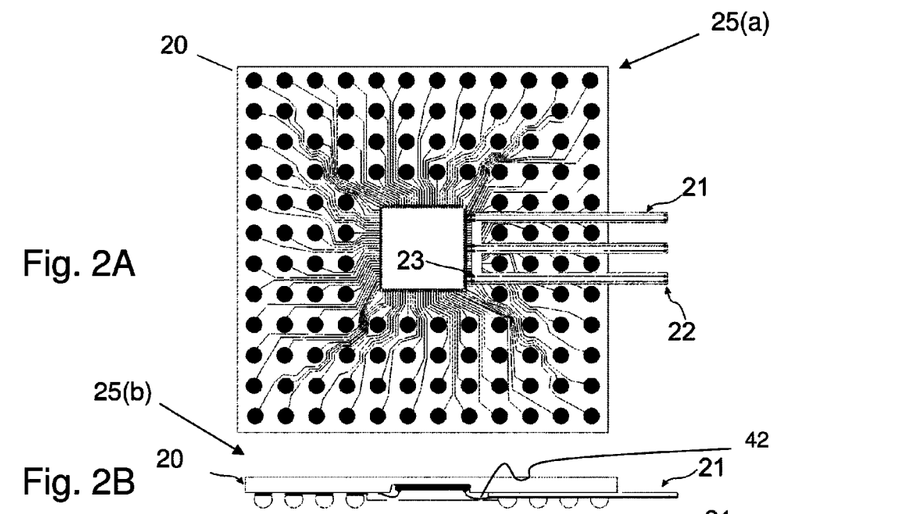
FIG. 2 provides an illustration of an embodiment wherein a separate circuit is bonded to an IC package to provide alternative interconnection pathways for signals exiting an IC and further illustrating, in cross section, two prospective embodiments for making such interconnections from the chip, either from the top or from the bottom of the package.

FIG. 2A illustrates top plan view of an embodiment of an otherwise unmodified IC package structure 25 that includes a substrate 20, an IC die 41 disposed in the center of the substrate, and a circuit structure 21 coupled with the substrate. In the embodiment of FIG. 2 the circuit structure 21 is comprised of three circuit arms (e.g., flexible circuits). Each circuit arm has a proximal end disposed proximate the IC die 41 and a distal end extending beyond the outer edge of the substrate 20. Each circuit arm 21 has at least one circuit trace, which extends the length of the arm on which it is located, from a first termination site 22 at the distal end of its arm, to a second termination site 23 at the proximal end of its arm. FIG. 2A depicts a circuit structure 21 comprised of three flexible circuit arms. However, the circuit structure could be comprised of a single circuit arm or a plurality of circuit arms.

Figure 2C:
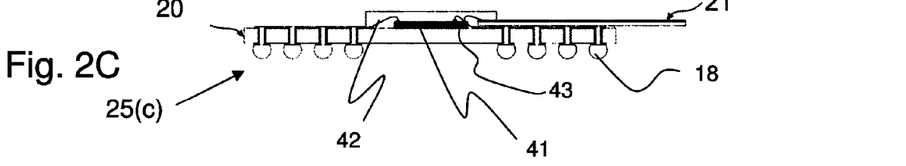

FIGS. 2B and 2C depict cross sectional views of alternative embodiments of the IC package structure 25 depicted in FIG. 2A. Within FIG. 2B, the IC package structure 25(b) has IC package terminations 18 (e.g. solder balls 18) on the same side of the package as the circuit structure(s) 21. The circuit structures 21 are coupled to corresponding IC die-terminals 43 by bond wires 42.

FIG. 2C depicts a cross sectional view of an embodiment 25(c) of the IC package structure 25 of FIG. 2A, wherein IC die terminations 43 are on one surface (e.g. top surface) of the IC die 41, and package terminations 18 are on the side opposite of the IC die, which, in FIG. 2C, is the bottom surface of the IC package substrate). Interconnection between the top and bottom surfaces of the IC package substrate 20 is achieved by conductive pathways such as plated through holes. Circuit structure 21 is attached to the IC package on the same side as the IC die terminals 43. The conductive path(s) of circuit structure 21 are interconnected to the IC die or chip terminals by means of bond wires 42.

Figure 3:
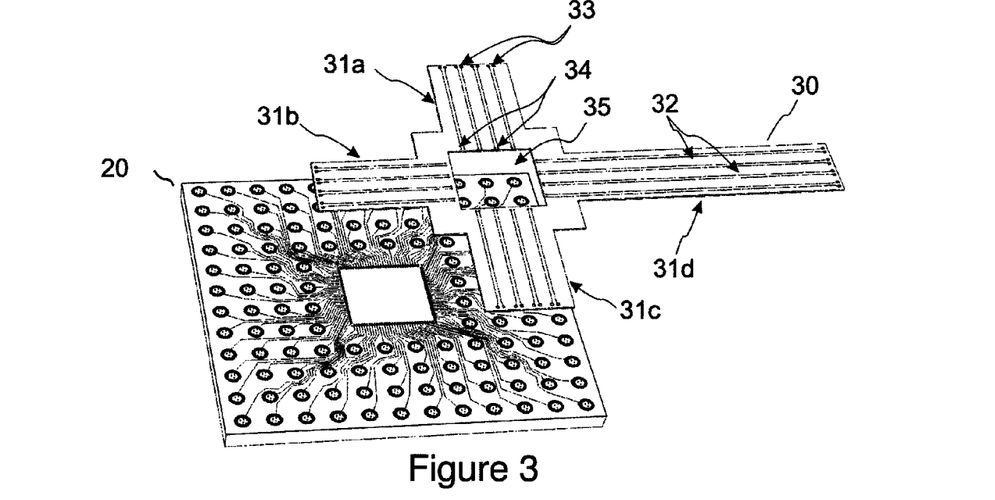
FIG. 3 provides an exploded perspective view of another embodiment illustrating major constituent elements of the construction.

FIG. 3 provides a perspective view of an IC package substrate 20 and a circuit structure 30 configured for attachment to the IC package substrate. The substrate has a center region configured to accommodate at least one IC die. The separately constructed circuit structure 30 has four arms 31a, 31b, 31c, 31d, each arm having an proximal end and distal end. Each arm contains conductive circuit traces extending from its proximal end to its distal end. The circuit structure is configured such that, when attached to the package substrate 20, the proximal end of each arm is disposed near the IC die. The distal end of arms 31a-31c are routed toward the a distal edge of the IC package, with the fourth arm 31d extending beyond the edge of the package. However, the length of each arm, and its conductive circuit traces, could be of any chosen length required for the design application, extending off of, to the edge of, or to a point on the IC package substrate 20. Though not shown, multiple layers of separate circuits may be placed one atop another to create multiple signal pathways. Access to each separately constructed circuit structure may be achieved by making successively wider openings in the central aperture in each successive separate circuit. Each arm 31a-31d includes one or more conductive circuit traces 32, 34. Each circuit trace has a first termination near the proximal end of its respective arm, and a second termination near the distal end of its respective arm.

Figure 4:
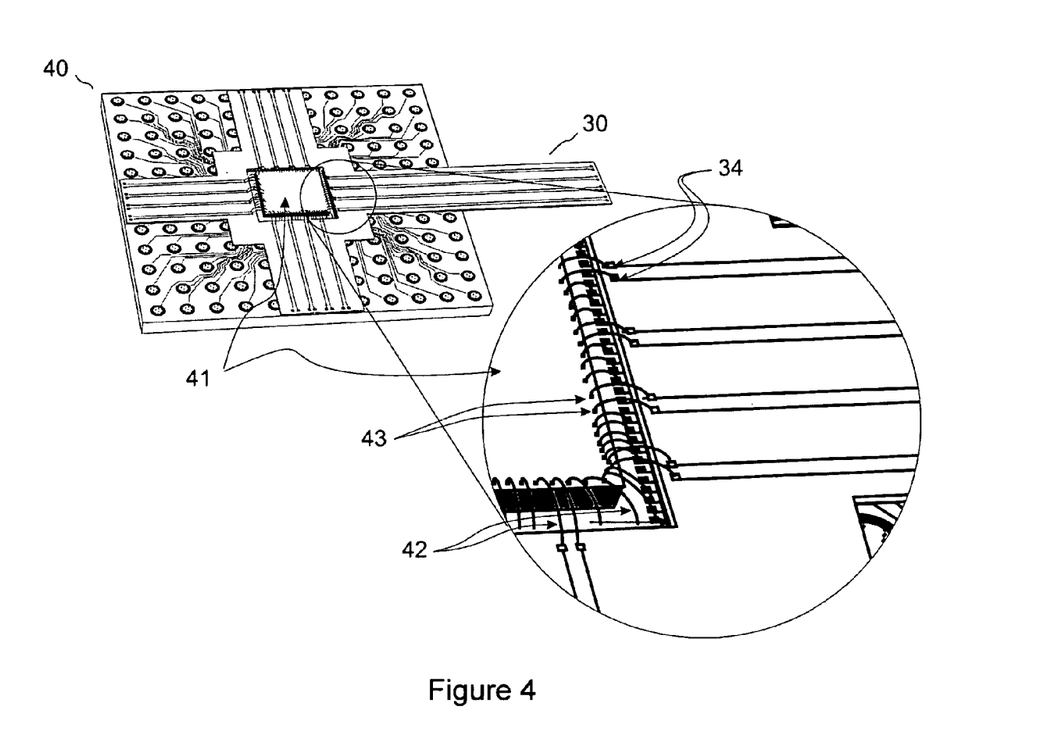
FIG. 4 provides perspective views of the elements shown in FIG. 3 in a partially assembled form and an enlargement of a section, to show greater detail.

FIG. 4 illustrates a perspective view of an embodiment in which the assembly of the IC package and the circuit structure shown in FIG. 3, comprises an IC die 41 wired bonded to the circuit structure 30 to create a partially completed assembly 40. An enlarged detail section shows contacts being made by wires 42 directly from first terminations on the chip 43 to second terminations 34 on the attached circuit structure 30. Though only one die is shown, stacking of additional IC die atop the first is also possible and can be used in combination with the stacking of additional circuit layer if so desired. Such additional circuit layers could also include coiled inductors and wireless antenna.

Figure 5:
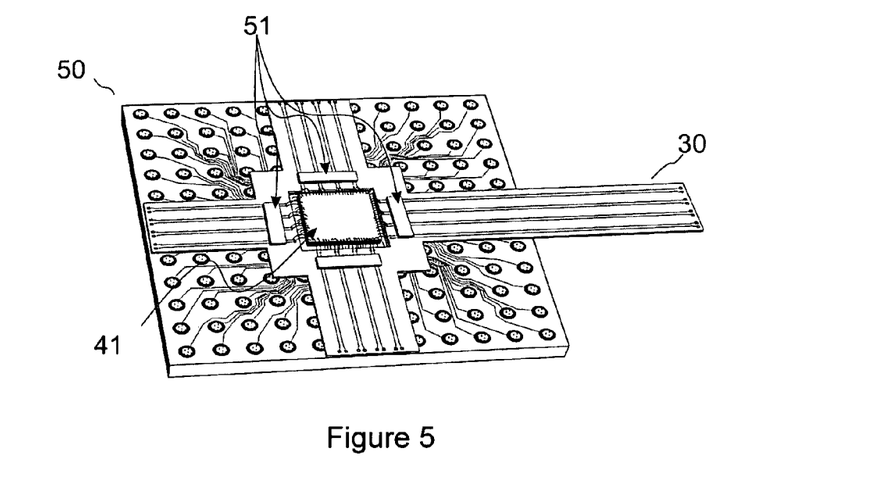
FIG. 5 illustrates, in a perspective view, an embodiment of the invention wherein more than 1 chip is interconnected within the package.

FIG. 5 illustrates an assembly embodiment 50 with separate circuit structure 30 having additional IC chips 51 mounted and interconnected to it using a suitable method (e.g. flip chip interconnection) and positioned between the IC 41 and the circuit paths with their terminations. Such chips could provide extra functionality or improve signal performance with external drivers. Again, stacking of IC chips one atop another and then interconnected to the combined structure package (not shown) is also possible to provide extra functionality.

Figure 6:
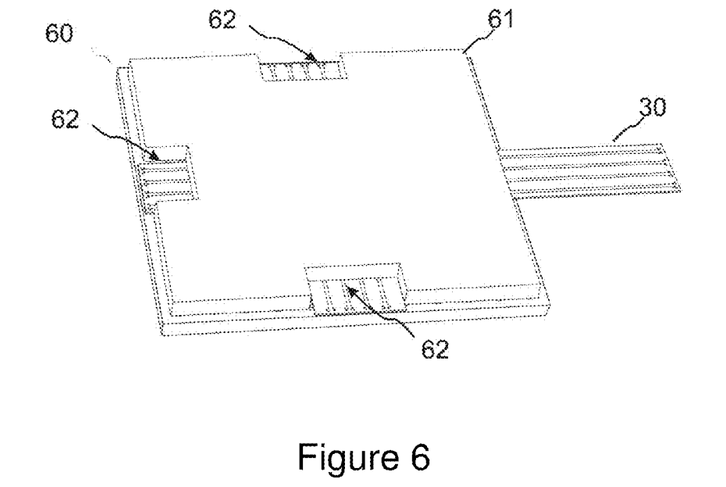
FIG. 6 illustrates, in a perspective view, an embodiment of the invention wherein the assembly is encapsulated and having contacts disposed for connection, both at the edge of the package and extending beyond the edge of the package on a length of circuit greater than the other lengths.

FIG. 6 illustrates the embodiment illustrated in FIG. 5 further processed to create a more complete assembly 60, having an encapsulant or overmold material 61 applied over the assembly to protect the IC chip mounted on and interconnected to both the unmodified IC package substrate and separate circuit 30, and leaving terminal locations 62 for the circuits open and free of encapsulant.

Figure 7:
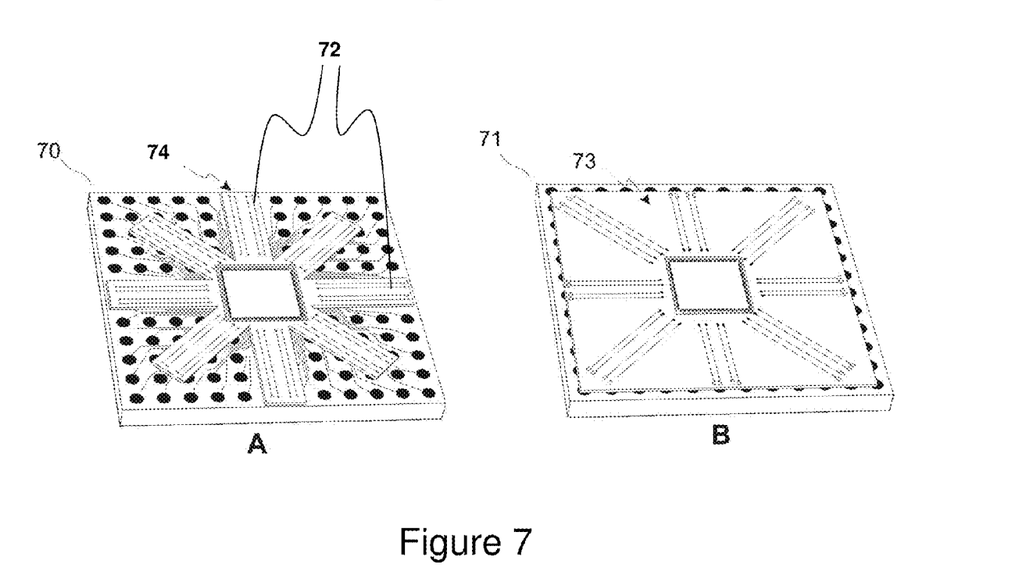
FIGS. 7A and 7B provide perspective views of partially assembled embodiments having circuits on the upper surface which egress at differing angles and directions.

FIG. 7A depicts a prospective view of an alternative embodiment for an assembly comprising a circuit structure 74 disposed on a surface of an integrated circuit package substrate 70. Circuit structure 74 includes features such as generally described in the foregoing FIGS. 2-6, but includes eight arms 72 extending away from the location of the central IC die in varying discrete directions, allowing for circuit paths to be routed at any desired angle. The distal end of some of the arms 72 of FIG. 7 extend to the edge of the IC package substrate 70. Other arms 72 terminate before reaching the edge of the IC package substrate.

FIG. 7B, depicts an alternative embodiment of a circuit structure 73 in assembly with an IC package. The circuit structure is a monolithic structure 73 having no individual arms extending from a center area. The circuit structure 73 has circuits routable along any desired path on its surface. The circuit structure 73 of FIG. 7B could also serve as a foundation for a coil or like structures. Any of the separate circuits could be constructed with perforations in them (not shown) that may improve bonding to the IC package and the flow and fill of any adhesives that might be used in the bonding process. Perforations may also facilitate and/or improve bonding of the overmolding or encapsulating material used to protect the IC and its interconnections.

Figure 8:
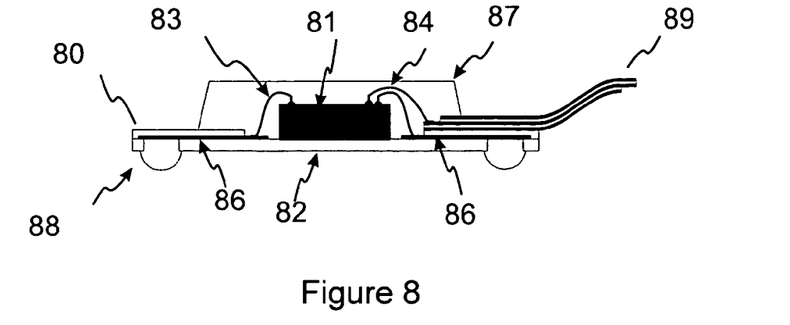
FIG. 8 illustrates an embodiment in cross section showing prospective elements of construction and having wire bonds made directly to a stripline circuit construction which exits the package on the edge.

FIG. 8 illustrates an embodiment comprising an unmodified IC package substrate 80 comprising an insulating dielectric base material 82, with an IC chip 81 mounted thereon. Circuit paths 86 on the base material of the package, terminate on the package at a solder ball terminal 88, and the IC chip 81 is interconnected to the circuit paths on the package by means of wire bonds 83. The mounted and bonded separate circuit 89, shown in the image has a three metal conductor layer stripline circuit. The separate circuit 89 has a first end disposed on the substrate surface proximate the IC chip 81, and extends beyond the perimeter of the IC package interconnection substrate. The separate circuit 89 is also interconnected to the chip by means of a separate wire bond 84. The chip, bonded separate circuit and the interconnections are protected by an encapsulant 87.

Figure 9:
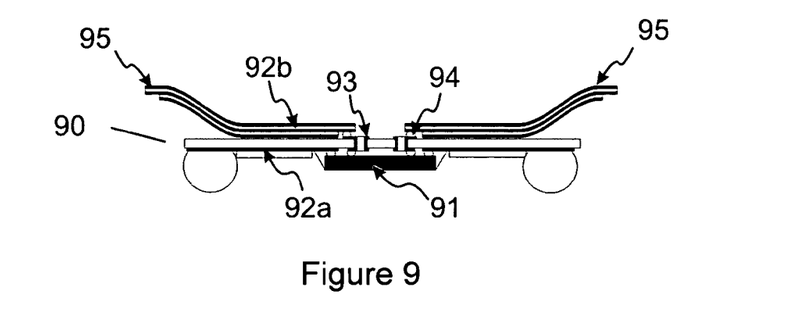
FIG. 9 illustrates an embodiment wherein more than one cable is mounted and interconnected to a surface opposite of the IC in a package.

FIG. 9 illustrates an embodiment wherein the separate circuits 95, shown in the figure as stripline circuits, are bonded and interconnected circuit paths 92b using an interconnection material such as solder or conductive adhesive 94. An interconnection path is made to the flip chip IC 91 on the opposite side of the package substrate by way of vias 93 passing through the IC package to the surface opposite the strip line circuits. The side having the flip chip also has circuit paths 92a to be mounted to a next level interconnection substrate.

Figure 10:
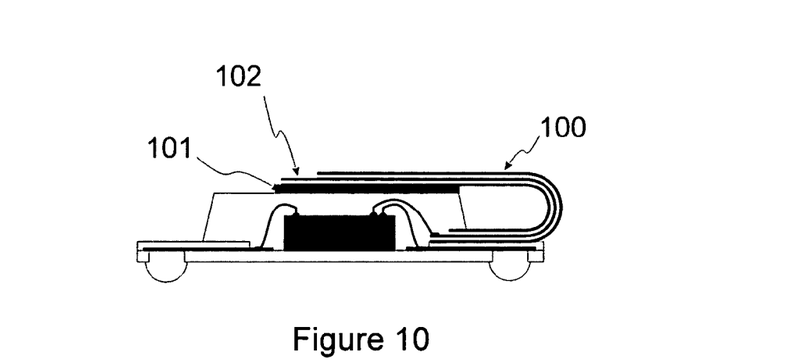
FIG. 10 illustrates an embodiment wherein the separate circuit is extended, folded back and bonded to the encapsulation which protects the IC chip.

FIG. 10 illustrates an embodiment wherein the separate circuit 100 is extended, folded back and bonded to the encapsulated chip and circuit using an adhesive 101 and having terminals 102 to provide a larger or more stable platform for interconnecting to and routing signals to one or more other IC chip packages distant or proximate to the first IC chip package.

Figure 11:
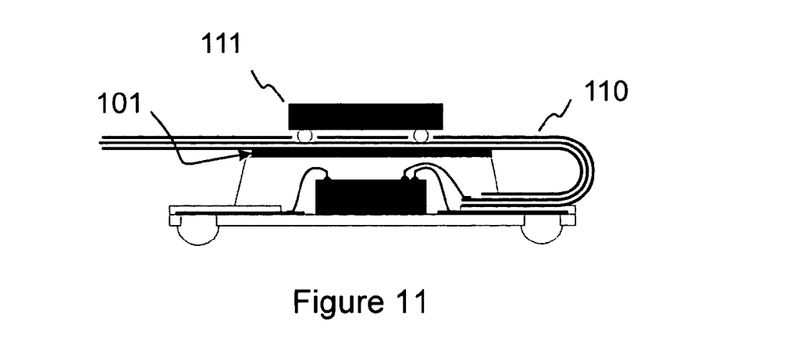
FIG. 11 illustrates an embodiment wherein the separate circuit is extended, folded back and bonded to the encapsulation, which protects the IC chip and having also a second IC chip interconnect to the circuit, and the circuit then extending to make interconnection to another electronic device or element.

FIG. 11 illustrates an embodiment wherein a bonded separate circuit (e.g., a stripline circuit) 100 has an extended length separate circuit and a separate IC chip or package 111 mounted on the separate circuit to provide either greater functionality or performance. The extended length separate circuit is bonded to the top of the encapsulated package using an adhesive 101.

Figure 12:
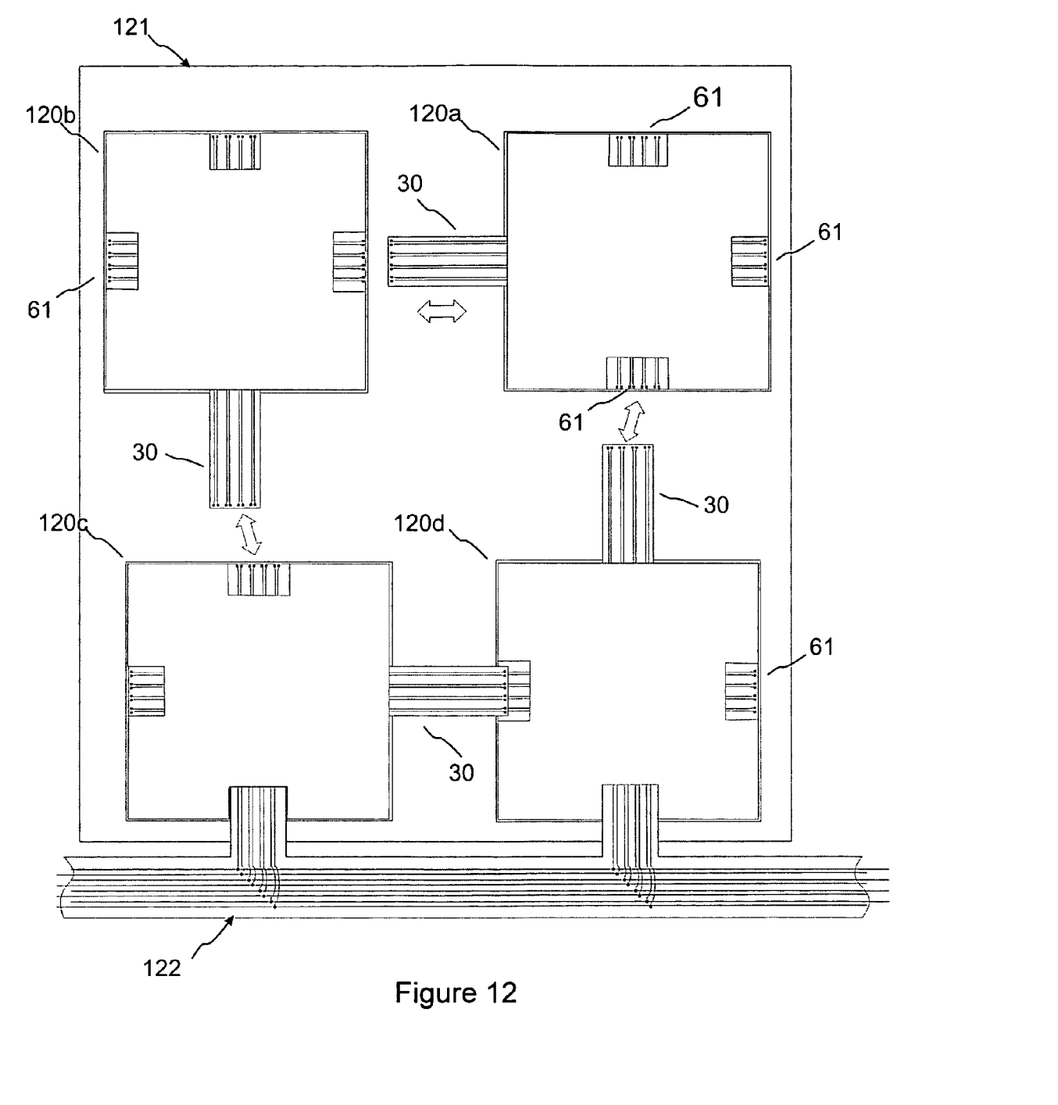
FIG. 12 provides an example of embodiment wherein multiple devices of varying embodiments are in process of assembly to a substrate and have interconnections to another element such as a cable or data bus.

FIG. 12 illustrates a partially assembled embodiment showing potential interconnection methods for some of the various described embodiments of finished parts. A base interconnection structure or printed circuit 121 has disposed for interconnection four package structures 120a, 120b, 120c and 120d, each having integral separate circuit extensions 30 and openings 61 allowing interconnections to be made either to one another or to other separate interconnecting structures, such as a common bus cable 122 or other interconnecting structure.

Figure 13:
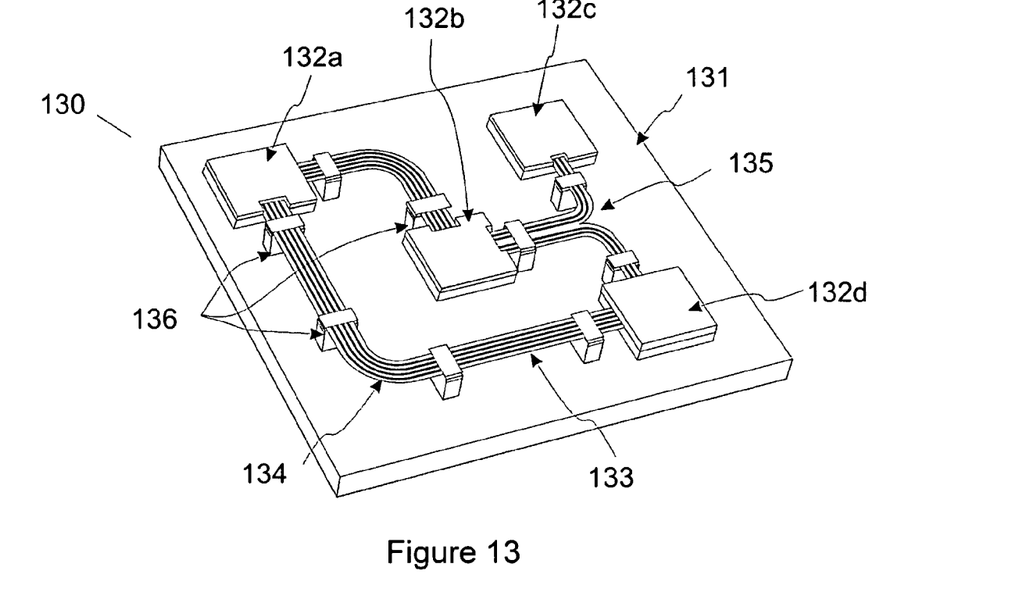
FIG. 13 provides a perspective view of an assembly comprised of various component embodiments, circuit elements and interconnection support pedestals which serve as separable or permanent connectors.

FIG. 13 shows a perspective view of another assembly embodiment 130 comprised of a base circuit structure 131 and four interconnected package structures 132a, 132b, 132c and 132d. While only four packages are shown, it will be readily appreciated that many packages are possible. The packages are interconnected by means of discrete circuit elements 133, 134, 135 of varying shapes and lengths. For example, section 133 is straight, 134 is curved and 135 is bifurcated. Also show are pedestals 136 which serve to support and interconnect the partial circuits. The pedestals can be of insulating material (e.g., polymer ceramic or glass), conductive material (e.g., metal or metal filled polymers), semi-conductive materials (e.g., silicon) or combinations thereof. The pedestals serve to support and can also align circuits they interconnect and can be used to make either permanent or temporary/separable connections.

Figure 14:
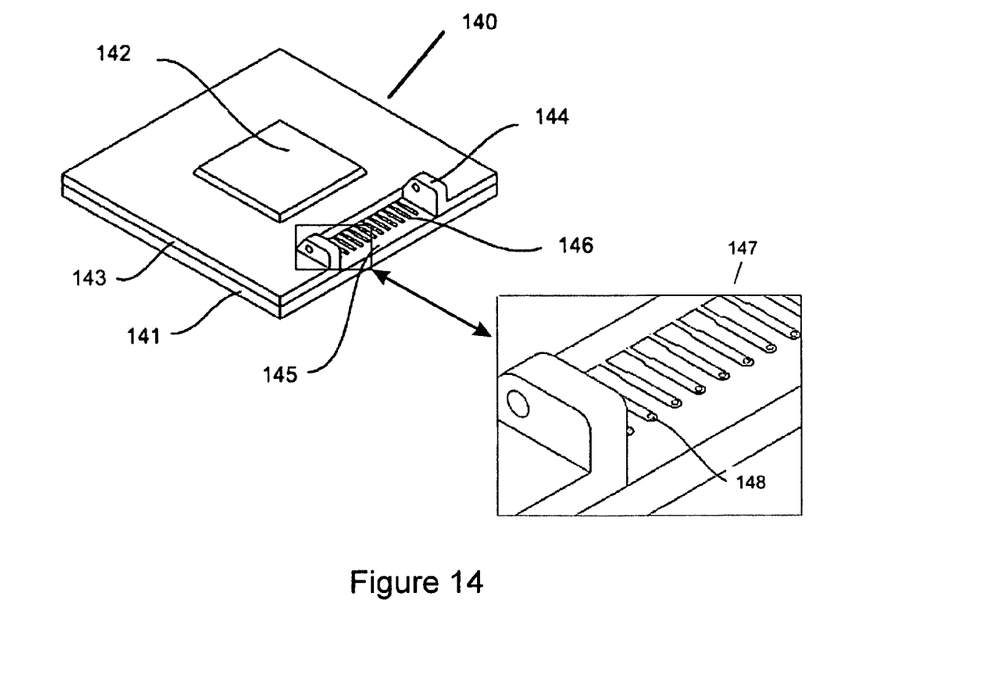
FIG. 14 provides a perspective view of an embodiment disposed to having a connector on IC package before being provided with a locking lever and an enlarged area providing detail of the contacts.

FIG. 14 shows a perspective view of an embodiment of an IC package assembly 140 comprising a base circuit 141 and a central die 142 and encapsulated with a suitable material 143, but having at least one open area 145 with exposed electrical contacts 146. An enlarged detail view 147 shows the contacts provided with conductive bumps 148 if desired. The encapsulating material 143 is disposed with a hinge position 144.

Figure 15:
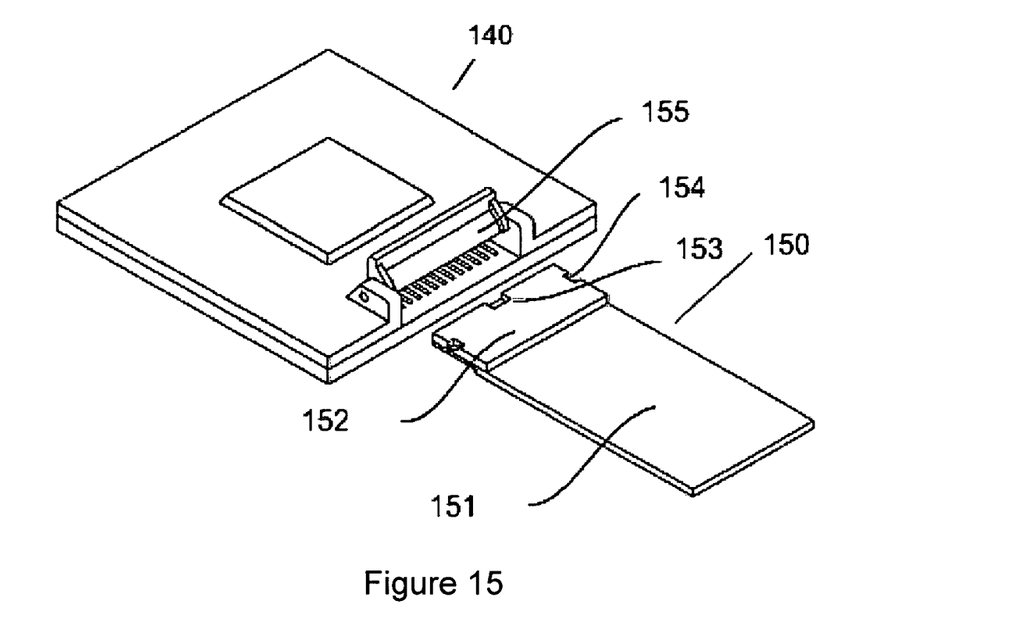
FIG. 15 provides the perspective view of an embodiment having a connector on IC package with a locking lever and a circuit assembly disposed for mating with the IC package connector.

FIG. 15 shows assembly 140 with a locking lever 155 in place and in an open position. Also shown is a partial view of a circuit assembly 150 disposed for mating to the IC package. Circuit assembly 150 has a base circuit 151 which may be a flexible circuit and has a stiffener 152 affixed to the base circuit. The stiffener can also serve as an alignment mechanism, such as providing a slot thereon which would capture a pin on the mating assembly (not shown).

Figure 16:
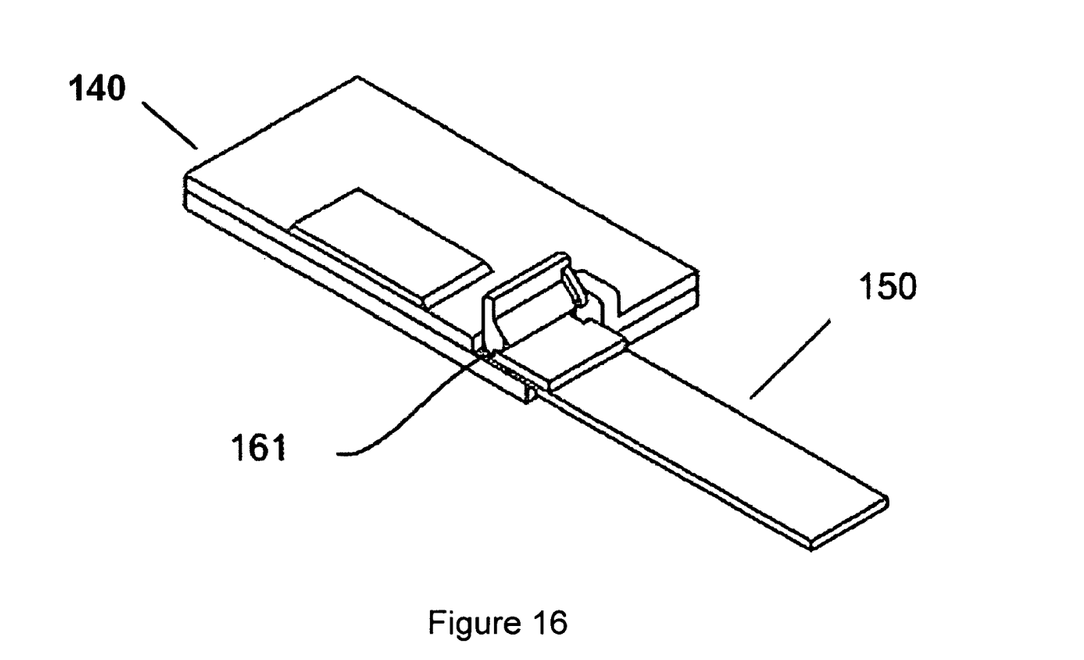
FIG. 16 is an illustration of a cross sectioned view through the middle of the IC package and the circuit assembly.

FIG. 16 illustrates a cross sectioned view through the middle of assembly 140 and the circuit assembly 150. The circuit assembly 150 has been inserted under locking lever 155. When notch 153 in stiffener 152 (shown in FIG. 15) touches stop 161, the circuit assembly 150 is in position for the next operation.

Figure 17:
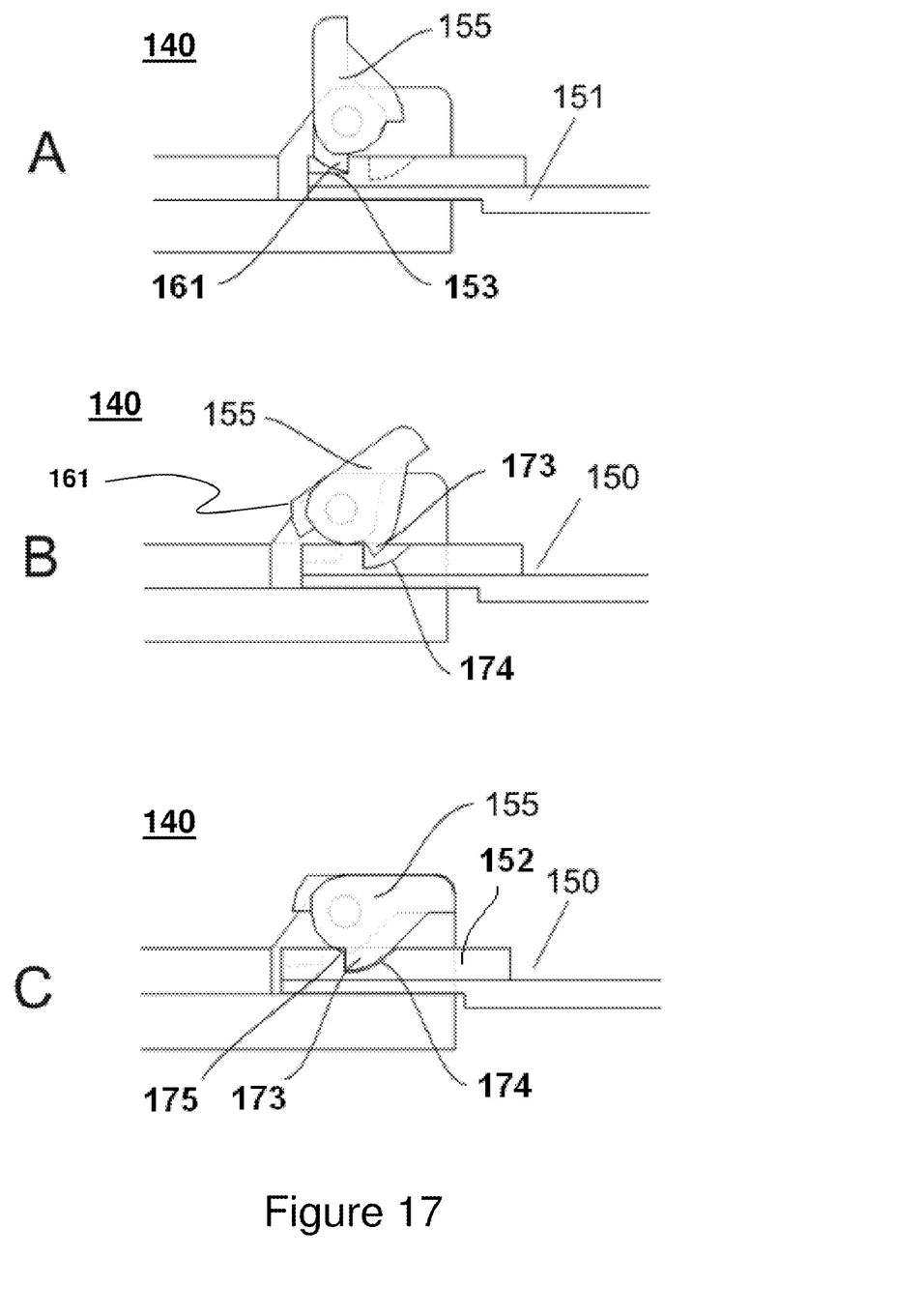
FIGS. 17A-17C are a close up series of images illustrating the operation of the connector mechanism.

FIGS. 17A-17C illustrate, in close-up cross section views, selected elements of FIG. 16 showing detail of the operation.

FIG. 17A shows of the locking lever 155 of the assembly 140 disposed above the stiffener 152 of circuit assembly 150. The locking lever comprises a stop 161 which, according to the position of FIG. 17A, extends into a notch 153 formed at the distal end of the stiffener. The horizontal surface of the notch terminates at a vertical surface of the stiffener 152, which is abutted against the locking lever stop 161.

FIG. 17B shows the locking lever 155 partially rotated toward the fully locked position. The pulls 173 are just beginning to engage the notches 174.

FIG. 17C shows the locking lever 155 in the fully locked position. The pulls 173 have pulled the flexible circuit assembly into the IC package. As the locking lever rotates into the locked position, the cam surface 175 on the locking lever 155 pushes down on the top of the sitffener 152, thus forcing the flexible circuit's contact pads downward. These two actions create contact force and contact wipe, thus increasing contact reliability.

Figure 18:
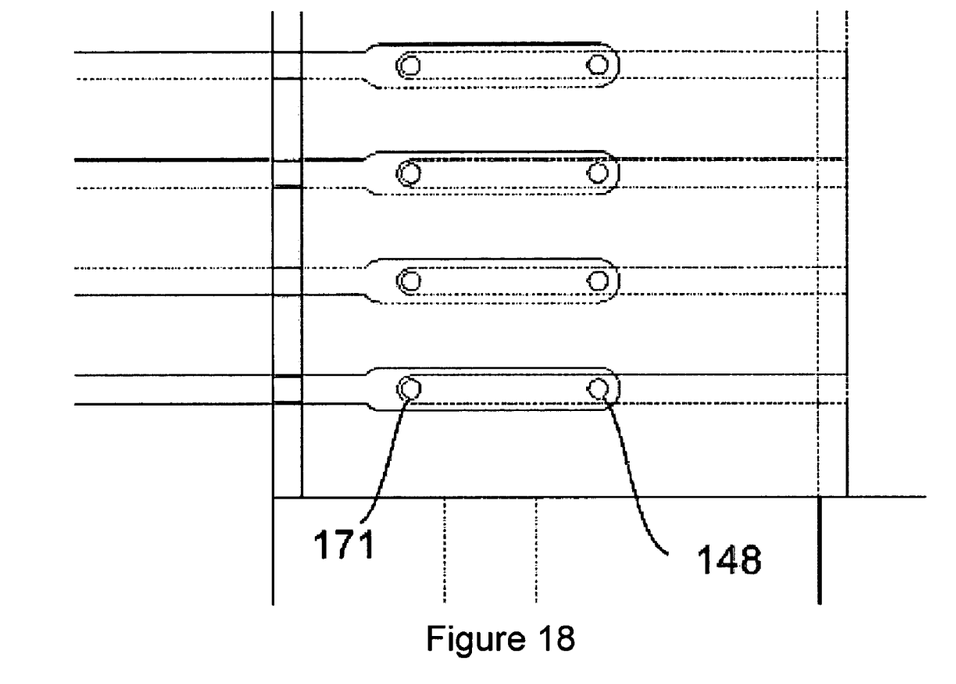
FIG. 18 illustrates gold bumps viewed through the flexible circuit assembly.

FIG. 18 shows a hidden section view through the top of assembly 140 and circuit assembly 150. The section enables us to view the locations of the electrical contacts 148 on assembly 140, and the electrical contacts 171 on the circuit assembly 150. The electrical contacts provide more than one contact per signal interconnection and are designed to eliminate the capacitive stub common when only one electrical contact is present per signal interconnection. The electrical contacts may be conductive dots or bumps of gold or other suitable corrosion resistant contact metal. The dots or bumps serve to connect with electrical contact pads. FIGS. 17A-17C illustrate how the contacts on each side of the interconnection interface move with respect to each other to provide contact wipe.

Figure 19:
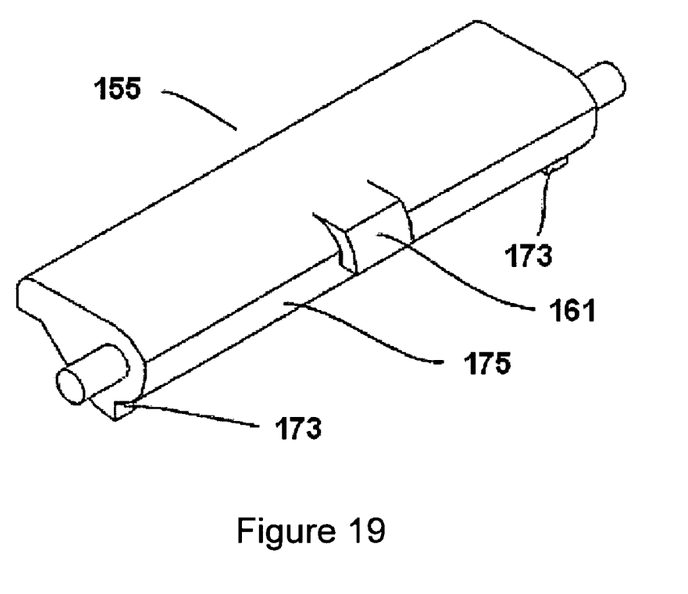
FIG. 19 is an illustration of the back of the locking lever in a perspective view.

FIG. 19 provides a rear view of the locking lever 155. The stop 161, pulls 173, and cam surface 175 of the locking lever 155 are shown. While members of the locking lever are shown as having defined dimensions for the illustration, they are not limited in size, shape or location on the locking lever nor are the size, shape or location of corresponding mating notches on the stiffener 152 with the major concern being that their primary functions are fulfilled.

Figure 20:
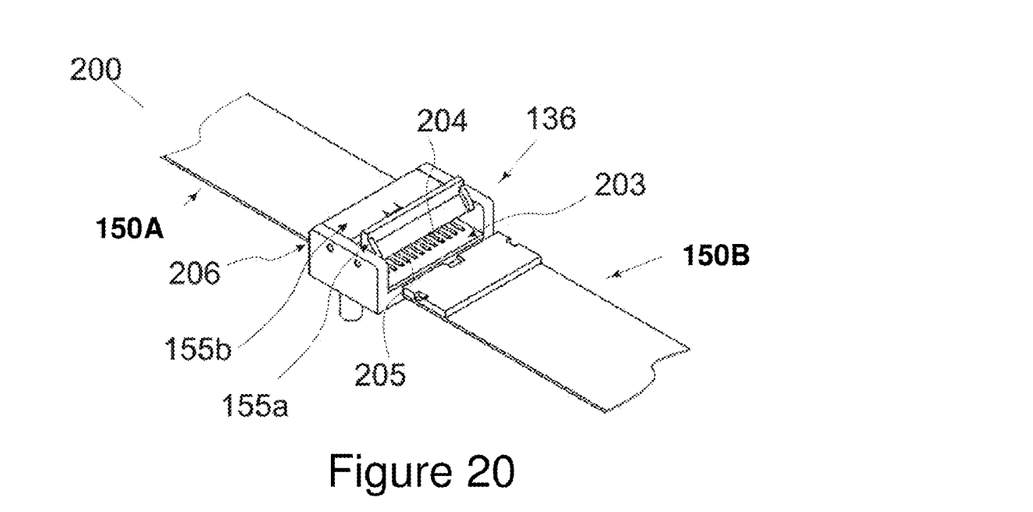
FIG. 20 provides a perspective view of a partially assembled pedestal connector with one side engaged to a circuit and the second side disposed for interconnection.

FIG. 20 illustrates a partially assembled embodiment 200 of the pedestal interconnection devices 136 shown in FIG. 13.

A pedestal connector 136 serves to electrically interconnect circuit assemblies 150, which are disposed to be positioned within the saddle of the body of the pedestal. Locking levers 155a, 155b are positioned back to back and have the same basic functions and configurations as locking lever 155 shown in FIGS. 15, 16, 17A-C and 19. In the figure, locking lever 155a is shown in the open position and disposed for connecting to circuit assembly 150A, while locking lever 155b is shown in the closed position with the circuit assembly 150B connected and locked into position. Circuit substrate 203, resides inside connector housing 206, and has a set of exposed electrical contacts 204 with conductive bumps 205 at or proximate to the end of the conductors. Conductive bumps 205 are similar to those items 146, 148 respectively shown in FIG. 14. There is an unseen, mirror image of electrical contacts with conductive bumps under locking lever 155b. The locking levers 155a, 155b provide the force required to electrically interconnect circuit assemblies 150 through circuit substrate 203. Either or both circuit assemblies 150 may be electrically attached to IC packages or other electrical components and provide electrical function such as a ground function. Circuit assemblies 150 can also be provided with alignment features such as slots which would capture pins on the pedestal (not shown).

Figure 21:
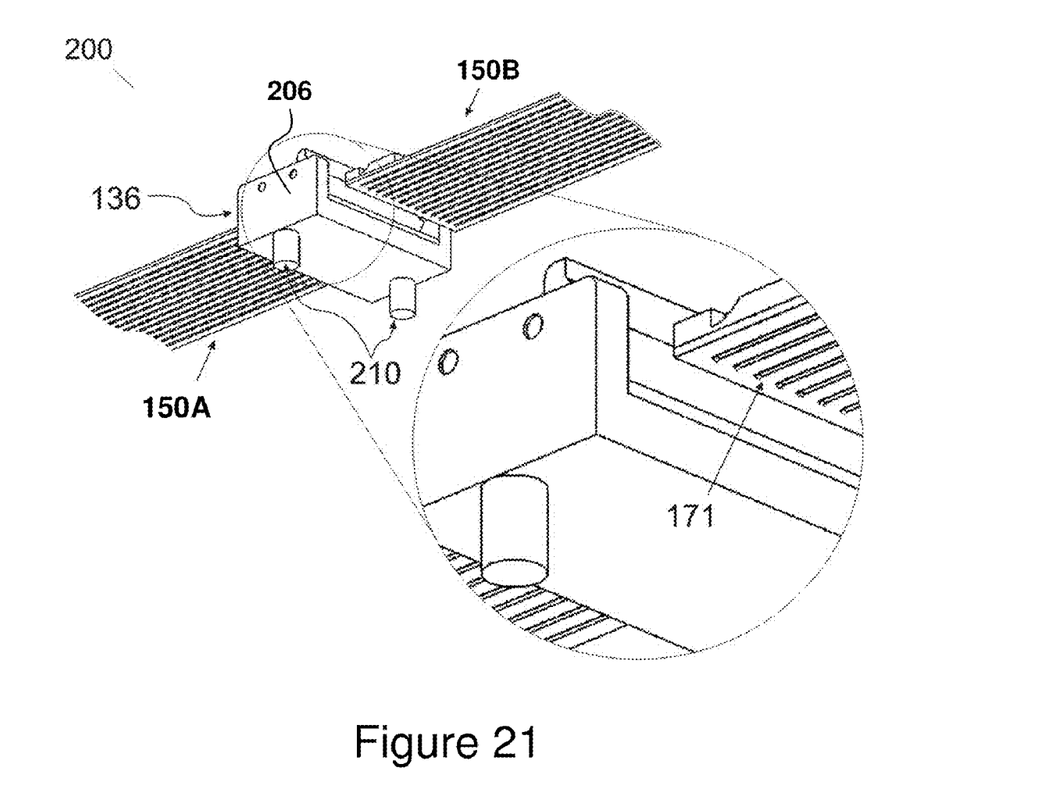
FIG. 21 provides a perspective view of a partially assembled pedestal connector of FIG. 20 from the opposite side, showing circuits and having an enlarged area to provide greater detail of the contact area.

FIG. 21 illustrates an isometric view from the bottom of the partially assembled structure 200. In the figure, pedestal electrical connector 136 is coupled with circuit assemblies 150A, 150B. Conductive bumps 171 are at the ends of the circuit assemblies' electrical contact pads. Posts 210 may be integral with the connector housing 206 may be positioned into holes in a printed circuit board or the like (not shown). These posts or additional posts on the bottom of the connector housing may be conductive and electrically connect electronic signals, ground or power, originating in the printed circuit board to the conductors in the circuit assemblies 150 and/or pedestal connector 136 or to conductors in the circuit substrate 203.

While much discussion has be given to the use of circuits bonded into the saddle of a pedestal, it should be clear to those of average skill in the art that the circuit conductors could be molded into the body of the pedestal and that the shoulders which define the saddle are not a mandatory requirement.

The locking lever, when operated, may provide the contact force necessary for low contact resistance while simultaneously moving the contact with respect to the contact pad to produce contact wipe. Present known art relative to locking levers provide no purposeful contact wipe, but instead commonly produce a butt contact which normally offers no contact wipe. Moreover, butt contact requires much larger contact forces than a contact with wiping action. Thus the embodiments illustrated may not require as much contact force as prior art. When the contact forces of all the interconnections in the embodiments are added, the necessary connector clamping force may thus be lower.

In FIG. 18 conductive bumps or conductive dots are placed at the ends of the contact pads in each circuit element. When the contacts are overlapped and electrically interconnected, they may fully or partially eliminate the capacitive stub that is typically created when only one conductive bump is present in the signal interconnection. FIG. 18 illustrates contact redundancy for each signal interconnection. FIG. 18 also illustrates alignment between the contacts in the direction defined by a line between the redundant contacts in the signal interconnection. In this embodiment, if one contact is farther away from or closer to the redundant contact in the signal interconnection, contact and signal integrity are still generally retained.

Although the invention has been described with reference to specific exemplary embodiments, modifications and changes may be made thereto without departing from the broader spirit and scope of the invention. The specification and drawings are, accordingly, to be regarded in an illustrative rather than a restrictive sense.

What is claimed is:

1. An integrated circuit package, comprising:
a substrate with first and second surfaces, the first surface having a plurality of circuit traces, each circuit trace having a proximal terminal and a distal terminal;
an integrated circuit die mounted on the first surface of said substrate, the integrated circuit die having a plurality of electrical die contacts; wherein at least some of the proximal terminals are electrically coupled with a corresponding electrical die contact;
one or more flexible circuits disposed on the first surface of the substrate, a flexible circuit having a flexible signal path protected by a flexible insulating material, the one or more flexible circuits positioned on the first surface of the substrate such that all of the distal terminals are at least partially exposed, wherein each flexible signal is electrically and mechanically connected with a corresponding electrical die contact by a wire bond.

2. The integrated circuit package of claim 1, wherein at least some of the electrical die contacts are coupled to a corresponding terminal by a wire bond.

3. The integrated circuit package of claim 1, wherein the one or more flexible circuits includes first and second flexible circuits extending outward from a central circuit body.

4. The integrated circuit package of claim 3, wherein the central circuit body is aligned along an edge of the integrated circuit die.

5. The integrated circuit package of claim 3, wherein the central circuit body is comprises a rigid structure.

6. The integrated circuit package of claim 1, further comprising a plurality of second level interface terminals on the second surface of the substrate and a plurality of vias extending between the first and second surfaces of said substrate, each via electrically coupling a second terminal of a circuit trace with a corresponding second level interface terminal.

7. The integrated circuit package according to claim 2, further including an encapsulant covering said wire bonds.

8. The integrated circuit package of claim 1 wherein said one or more flexible circuits comprises an impedance controlled circuit.

9. The integrated circuit package of claim 1 wherein said one or more flexible circuits comprises a differential pair.

10. The integrated circuit package of claim 1 wherein said one or more flexible circuits comprises a single ended circuit.

11. The integrated circuit package of claim 1 wherein said one or more flexible circuits includes a shielded circuit.

12. The integrated circuit package of claim 1 wherein said one or more flexible circuits comprises an unshielded circuit.

13. The integrated circuit package of claim 3, wherein the first and second flexible circuits are geometrically parallel.

14. The integrated circuit package of claim 1, wherein said one or more flexible circuits comprises a multi-layered flexible circuit, each layer comprising at least one flexible signal path, including first and second flexible signal paths disposed in corresponding first and second layers.

15. The integrated circuit package of claim 14, wherein a first end of said multi-layered flexible circuit comprises a stair-step structure having first and second stair stepped surfaces, wherein a portion of the first flexible signal path is disposed on the first stair step surface, and a portion of the second flexible signal path is disposed on the second stair step surface.

16. The electronic assembly of claim 1, wherein the flexible insulating material of the one or more flexible circuits is bonded to the substrate of the integrated circuit package.

17. The electronic assembly of claim 3, wherein said first and second flexible circuits are equal in length.

18. An electronic assembly, comprising:
a substrate with first and second surfaces;
at least one circuit trace disposed on the first surface of the substrate, a circuit trace having a proximal terminal and a distal terminal;
a integrated circuit die disposed on the first surface of the substrate, the integrated circuit die comprising a plurality of integrated circuit die bond pads, wherein at least some of the proximal terminals are electrically coupled with a corresponding die bond pad; and,
one or more flexible circuits disposed on the first surface of the substrate, a flexible circuit comprising one or more flexible signal paths disposed within an elongated arm comprising flexible insulating material, wherein said one or more flexible circuits are positioned on the substrate surface such that at least a portion of every distal terminal is exposed, wherein each flexible signal path is electrically and mechanically connected with a corresponding die bond pad by a wire bond.

19. The electronic assembly of claim 18, further comprising one or more wire bonds electrically coupling a die bond pad to a corresponding terminal.

20. The electronic assembly according to claim 18, further including an encapsulant covering said one or more wire bonds.

21. The electronic assembly of claim 18, said at least one flexible circuit comprising first and second flexible circuits.

22. The electronic assembly of claim 21, further comprising a central body extending between said first and second flexible circuits.

23. The electronic assembly of claim 22, wherein the central body is aligned along an edge of the integrated circuit die.

24. The electronic assembly of claim 22, wherein the central body comprises a rigid structure.

25. The electronic assembly of claim 18, said at least one flexible circuit comprising an impedance controlled circuit.

26. The electronic assembly of claim 18, wherein said at least one flexible circuit comprises a differential pair.

27. The electronic assembly of claim 18, wherein said at least one flexible circuit comprises a single ended circuit.

28. The electronic assembly of claim 18, wherein said at least one flexible circuit includes a shielded circuit.

29. The electronic assembly of claim 18, wherein said at least one flexible circuit comprises an unshielded circuit.

30. The electronic assembly of claim 21, wherein the first and second flexible circuits are geometrically parallel.

31. The electronic assembly of claim 18, wherein said at least one flexible circuit comprises a multi-layered flexible circuit, each layer comprising at least one flexible signal path, including first and second flexible signal paths disposed in corresponding first and second layers.

32. The electronic assembly of claim 31 wherein a first end of said multi-layered flexible circuit comprises a stair-step structure having first and second stair stepped surfaces with corresponding first and second flexible signal paths.

33. The electronic assembly of claim 18 wherein the at least one flexible circuit comprises a flexible insulating member bonded to the substrate of the integrated circuit package.

34. The electronic assembly of claim 21 wherein said first and second flexible circuits are equal in length.

35. The integrated circuit package of claim 1, further comprising a plurality of solder balls, each solder ball disposed on a corresponding second terminal of a circuit trace.

36. The integrated circuit package of claim 6 further comprising solder balls disposed on the second level interface terminals.

37. The integrated circuit package of claim 1, wherein each of the one or more flexible circuits are electrically connected to a corresponding electrical die bond pad through a wire bond.

38. The electronic assembly of claim 18, further comprising one or more solder balls electrically coupled to a corresponding circuit trace.

39. The electronic assembly of claim 38 wherein at least some of the one or more solder balls are mechanically coupled with a corresponding distal terminal of a circuit trace.

40. The electronic assembly of claim 39, further comprising:
at least one second level interface terminal disposed on the second surface of the substrate; and,
at least one conductive via electrically coupling a second level interface terminal to a distal terminal on the first surface of the substrate.

41. The electronic assembly of claim 40, further comprising at least one solder ball mechanically coupled to a corresponding second level interface terminal.

* * * * *